April 14, 1964 R. L. ROUSE ETAL 3,129,119

PRODUCTION OF P.N. JUNCTIONS IN SEMICONDUCTOR MATERIAL

Filed April 15, 1960 2 Sheets-Sheet 1

INVENTORS
Robert Lindsay Rouse
James Wakefield
John Bernard Willis
Ronald Bullough
Ronald Charles Newman
BY Lawson and Taylor

AFTER HEATING

INVENTORS
Robert Lindsay Rouse
James Wakefield
John Bernard Willis
Ronald Bullough
Ronald Charles Newman
BY
Lawson and Taylor United States Patent Office 3,129,119

Patented Apr. 14, 1964

3,129,119
PRODUCTION OF P.N. JUNCTIONS IN SEMICONDUCTOR MATERIAL

Robert Lindsay Rouse, Caversham, Reading, James Wakefield, Beenham, near Reading, John Bernard Willis, Sulhamstead Hill, near Reading, and Ronald Bullough and Ronald Charles Newman, Earley, Reading, England, assignors to Associated Electrical Industries Limited, London, England, a British company Filed Apr. 15, 1960, Ser. No. 22,637
Claims priority, application Great Britain Apr. 22, 1959
4 Claims. (Cl. 148—1.5)

Figure 1:
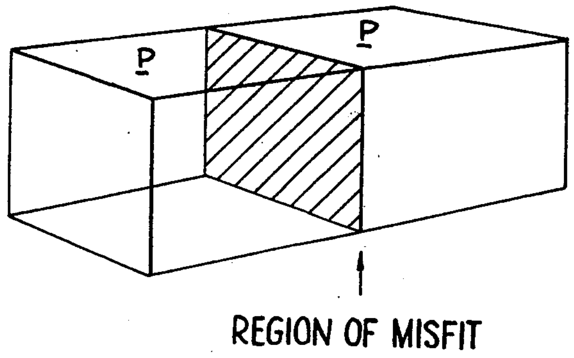

This invention relates to the production of p-n junctions in semi-conductor material and to the utilisation of such junctions.

In the specification of U.S. application Serial No. 15,934, filed on March 18, 1960, by us and assigned to the assignee of the present application is described a method of making diode structures by the formation of cylindrical p-n junctions round single dislocations in a body of mono-crystal semi-conductor material initially containing both donor and acceptor impurity activators. In that method the impurity activator which is present in the higher concentration is caused preferentially to diffuse to, and precipitate at, the dislocations, and hence produce a change of conductivity type in a cylindrical region immediately surrounding the dislocation; this diffusion and precipitation is effected by controlled heat-treatment. The region containing the dislocation is then isolated and contacts made to the p- and n-regions.

The prior specification was thus concerned with the formation of p-n junctions around single dislocations; it is the object of the present invention to provide an analogous process whereby a planar multiple p-n junction structure is produced.

According to the present invention, a p-n- junction of extended area is produced by heating a body of mono-crystal semiconductor material containing impurity activators of opposite conductivity types and haivng an internal planar crystal boundary so as to produce controlled diffusion and precipitation at the crystal boundary of one or more of the activators, whereby to deplete the region in the immediate neighbourhood of the boundary of one type of impurity activator and thereby to form an adjacent region of opposite conductivity type to that of the body. Ohmic contacts may subsequently be attached to the region and to the body at opposite sides of the region so as to produce a transistor.

An internal crystal boundary may be defined as the surface which separates two structural regions within a mono-crystal differing only by an arbitrary relative misorientation. For the purposes of this invention, we are concerned only with planar boundaries.

The carrying out of the invention will now be described with particular reference to silicon as the semi-conductor and to aluminium as the p-type impurity and phosphorus as the n-type impurity. Both the p-type and n-type impurities used to form the junction are introduced into the crystal in a substantially uniform concentration before the heat treatment takes place. This so-called "doping" of the crystal can be carried out during the crystal-growing process, i.e., when mono-crystalline semi-conductor material is being grown from the melt, by doping the melt with both aluminium and phosphorus. In the present case an excess of aluminium is introduced so that the crystal is initially of p-type. For diffusion of impurities to occur, the silicon is heated to a temperature of approaching the melting point, e.g., 1000–1250° C., either in vacuo or in an inert gas atmosphere. Typically, the silicon specimens may be sealed into a quartz container which is evacuated or which contains an inert gas, the whole container then being heated in a resistance furnace.

Aluminium can combine with oxygen at crystal boundaries to form a stable complex. If the crystal has been prepared in the quartz crucible, the oxygen will already be present in the crystal. The crystal boundary consists of regions of fit and misfit on an atomic scale, and in the latter regions a second phase, such as an aluminium-oxygen complex, can form. In an analogous manner to that described in the prior specification for the single dislocation, there will be a planar p-n junction formed on each side of the boundary.

Figure 2:
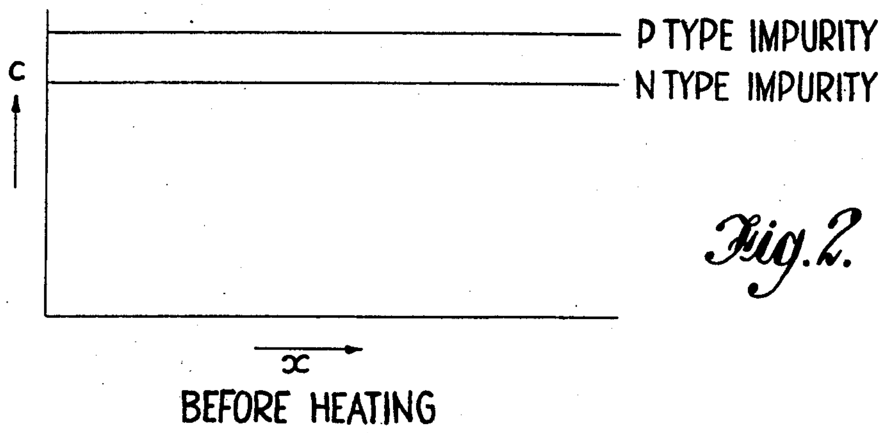
Figure 3:
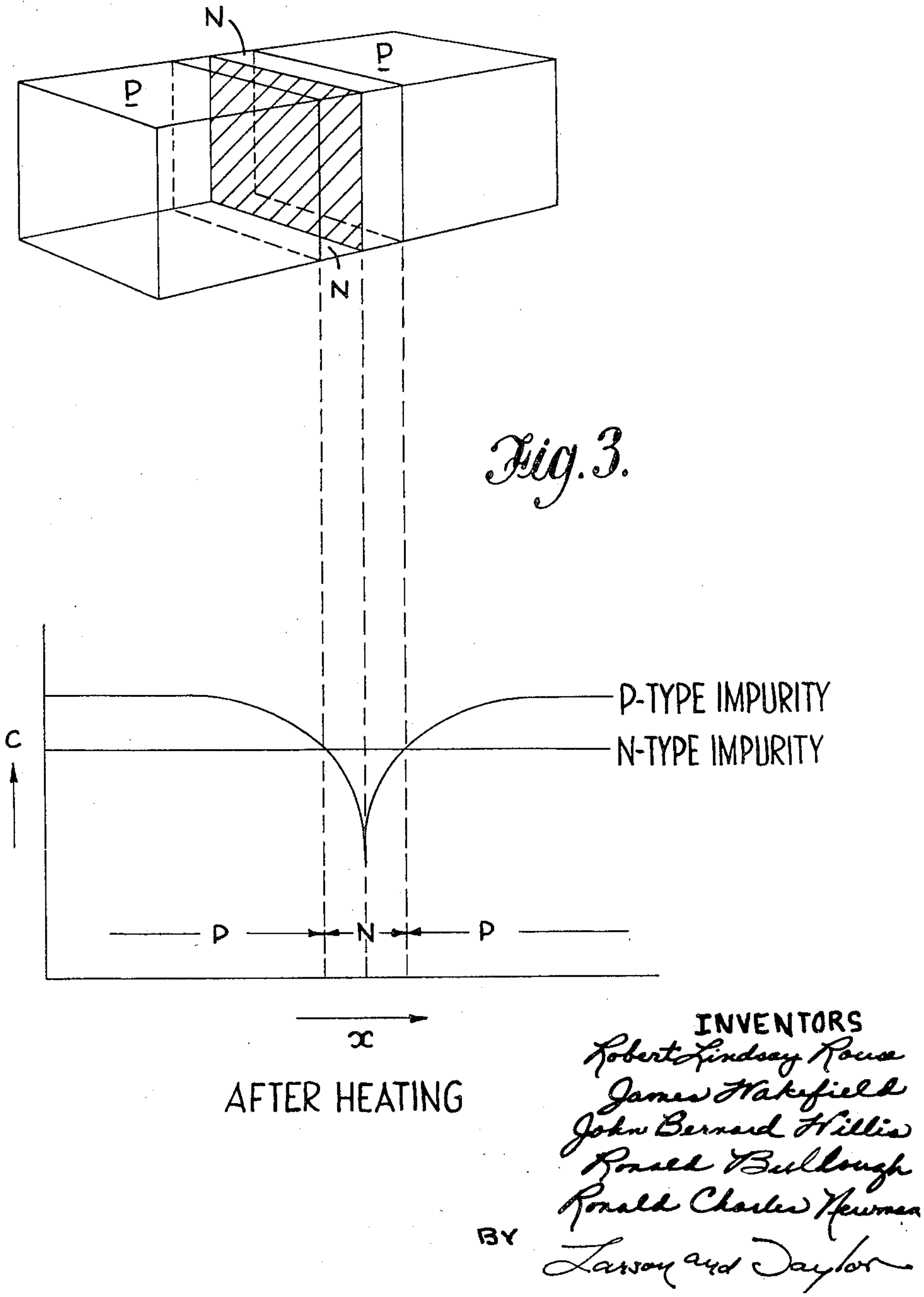

A representation of a rectangular block of p-type material containing a planar boundary is shown in FIG. 1 of the accompanying drawings, and the uniform concentration distributions of the p-type and n-type impurities, before heating, are shown in FIG. 2 thereof. The corresponding situation after heat treatment is shown in FIG. 3. The p-type concentration is considerably reduced at the crystal boundary, and a p-n junction is formed some distance away on each side of the boundary where the concentrations of the p-type and n-type impurities are equal.

In general, all types of crystal boundary where atomic misfit occurs are suitable for forming p-n junction structures. To prepare a usable device, the crystal boundary must be introduced into the crystal in a controlled manner. This may conveniently be done, for example, during the known crystal growing process in which a seed crystal is introduced into, and withdrawn from, a melt of purified silicon to produce an ingot. The technique is described with particular reference to tilt boundaries.

A tilt boundary is a special case of the general internal planar boundary for which the misorientation can be defined by a rotation about an axis within the planar boundary. A tilt boundary therefore consists of an array of parallel lines of misfit. If the angle of tilt is fairly small, say less than 5°, these lines of misfit can be identified as the individual edge dislocations which comprise the boundary. Since it is desired to produce a planar p-n junction structure, the spacing between the lines of misfit must be very small compared with the mean diffusion length of the aluminium in silicon. An angle of tilt greater than 1° is therefore suitable.

To introduce such a tilt boundary into the crystal, a suitable seed crystal is used in the usual crystal drawing process for growing crystals. The crystal orientations normally used are either <111> or <100>, but other orientations can be used. The seed crystal is either a crystal already containing a tilt boundary (bi-crystal seed) or consists of two identical crystals which are rotated with respect to each other by the required angle. The boundary is propagated down the growing mono-crystal ingot which then becomes a bi-crystal.

A form of high angle boundary which is particularly suitable for the process is the so-called semi-coherent boundary in which there is a proportion of lattice sites along the boundary common to both halves of the bi-crystal. An example of this is the (331) crystal boundary (see J. Hornstra, Physica, vol. 25, pp. 409–422, 1959, FIG. 5).

The p-n-p structure obtained after heat-treatment is shown in FIG. 3. For any particular boundary, the width of the n-type layer can be controlled by varying, (1) the temperature at which heat treatment is carried out, (2) the duration of the heat treatment, and (3) the relative levels of the n-type and p-type impurities in the silicon.

After the formation of the required p-n-p (or n-p-n) structure, a wafer containing this structure may be obtained from the semi-conductor body, for example by cutting or grinding, and electrical contacts made to the various regions. If desired, a suitable etching or cleaning treatment can be given subsequent to this cutting or grinding.

Figure 4:
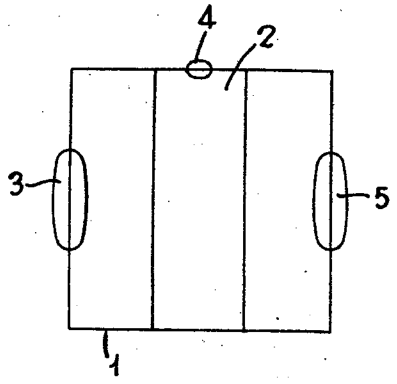

FIG. 4 shows one form of a completed transistor obtained by the process of the invention. In this figure, 1 is the semi-conductor body, 2 the base layer which contains the internal crystal boundary, 3 the emitter contact, 4 the base contact, and 5 the collector contact.

Figure 5:
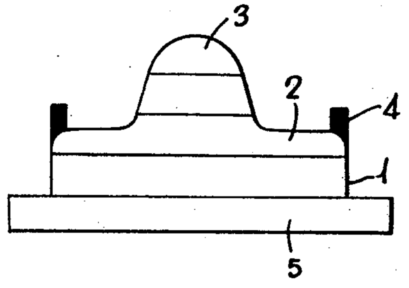

Another form is shown in FIG. 5, in which part of the emitter region 3 has been covered with a suitable masking substance, such as wax, and the outer region etched away so as to expose the base region 2 and so permit the use of the ring base contact 4. The wax is removed before attaching the emitter contact 3, while the collector contact 5 consists of a disc or plate.

It is obvious that other forms of transistor configuration could be employed.

This method of controlled preferential diffusion to and precipitation at an internal crystal boundary is also capable of extension to multiple junction structures adjacent to a crystal boundary using suitably doped crystals. Furthermore, it is obvious that a multiplicity of such p-n junctions can be formed in one sample containing a multiplicity of boundaries. Contacts to the various p- and n-regions can then be made by techniques commonly used in transistor manufacture, thus producing transistors and similar devices.

What we claim is:

1. The process of producing a p-n junction of extended area which consists in heating a body of monocrystal semiconductor material containing oxygen together with impurity activators of opposite conductivity types in homogeneous concentration, the activator concentration of one conductivity type being initially predominant, said body having an internal planar crystal boundary, so as to produce controlled diffusion to, and precipitation with said oxygen at, the crystal boundary, of at least one of said initially predominant activators, whereby to deplete the region in the immediate neighbourhood of the boundary of said one type of initially predominant activator and thereby to form an adjacent region of opposite conductivity type to that of the body.

2. The process of producing a p-n junction of extended area which consists in heating to a temperature of between 1000 and 1250° C. a body of n-type monocrystal silicon containing oxygen together with aluminium and phosphorus as impurity activators in homogeneous concentration, said aluminium being initially predominant, said body having an internal planar crystal boundary so as to produce controlled diffusion to, and precipitation at, said boundary of said aluminium activators, whereby to deplete the said p-type region in the immediate neighbourhood of said boundary of said aluminium and thereby form an n-type region adjacent said boundary.

3. The process of producing a p-n junction of extended area in a body of monocrystal silicon which consists in preparing an ingot of monocrystal silicon by seed crystal withdrawal from a melt of purified silicon containing oxygen together with uniform impurity activator concentrations of aluminium and phosphorus with aluminium in excess, the seed crystal containing a planar crystal boundary which is reproduced in the ingot, heating to a temperature of between 1000 and 1250° C. a body of monocrystal silicon obtained from the ingot whereby to cause the depletion of the aluminium in the region in the immediate neighbourhood of the crystal boundary and thereby to form an adjacent region of opposite conductivity type to that of the body.

4. The process of producing a p-n junction of extended area in a body of monocrystal silicon which consists in preparing an ingot of monocrystal silicon containing dissolved oxygen by seed crystal withdrawal from a melt of purified silicon containing uniform impurity activator concentrations of aluminium and phosphorus with aluminium in excess, the seed crystal containing a tilt boundary which is reproduced in the ingot, heating to a temperature of between 1000 and 1250° C. a body of monocrystal silicon obtained from the ingot whereby to cause the combination of aluminium with oxygen in the region in the immediate neighbourhood of the tilt boundary with resulting depletion of aluminium in that region and thereby to cause said region to be of opposite conductivity type to that of the body.

References Cited in the file of this patent

UNITED STATES PATENTS

| | | |
|---|---|---|
| 2,836,523 | Fuller | May 27, 1958 |
| 2,842,723 | Koch et al. | July 8, 1958 |
| 2,849,664 | Beale | Aug. 26, 1958 |
| 2,900,286 | Goldstein | Aug. 18, 1959 |
| 2,932,594 | Mueller | Apr. 12, 1960 |
| 2,937,960 | Pankove | May 24, 1960 |
| 2,954,307 | Shockley | Sept. 27, 1960 |
| 2,979,427 | Shockley | Apr. 11, 1961 |
| 3,009,841 | Faust | Nov. 21, 1961 |

OTHER REFERENCES

Bilby: Journal of Physical Society Japan, volume 10, No. 8, August 1955, pages 673–679.

Karstensen: Journal of Electronics and Control, volume 3, July–December 1957, pages 305–307.